(12) United States Patent
Koo et al.

(10) Patent No.: US 7,608,901 B2
(45) Date of Patent: Oct. 27, 2009

(54) SPIN TRANSISTOR USING STRAY MAGNETIC FIELD

(75) Inventors: Hyun Cheol Koo, Seoul (KR); Jong Hwa Eom, Seoul (KR); Suk Hee Han, Seoul (KR); Joon Yeon Chang, Seoul (KR); Hyung Jun Kim, Daegu (KR)

(73) Assignee: Korea Institute of Science and Technology, Seoul (KR)

( * ) Notice: Subject to any disclaimer, the term of this patent is extended or adjusted under 35 U.S.C. 154(b) by 89 days.

(21) Appl. No.: 11/777,228

(22) Filed: Jul. 12, 2007

(65) Prior Publication Data

US 2008/0169492 A1  Jul. 17, 2008

(51) Int. Cl.
*H01L 29/72* (2006.01)

(52) U.S. Cl. ............... 257/421; 257/902; 257/E49.003; 257/E43.001; 977/933

(58) Field of Classification Search ........... 257/295, 257/288, 421, E43.001, E49.003, 902; 977/933
See application file for complete search history.

(56) References Cited

U.S. PATENT DOCUMENTS

| | | | | |
|---|---|---|---|---|
| 5,654,566 | A * | 8/1997 | Johnson | 257/295 |
| 6,753,562 | B1 | 6/2004 | Hsu et al. | |
| 6,956,269 | B1 | 10/2005 | Vashchenko et al. | |
| 6,963,091 | B1 * | 11/2005 | Vashchenko et al. | 257/213 |
| 7,085,109 | B1 | 8/2006 | Ishiwata | |
| 7,095,070 | B2 * | 8/2006 | Lee et al. | 257/295 |
| 7,200,037 | B2 * | 4/2007 | Saito et al. | 365/158 |
| 7,307,299 | B2 * | 12/2007 | Koo et al. | 257/288 |
| 7,342,244 | B2 * | 3/2008 | Kaushal et al. | 257/24 |
| 2003/0214004 | A1 | 11/2003 | Sato et al. | |
| 2005/0047204 | A1 | 3/2005 | Johnson | |
| 2006/0289970 | A1 * | 12/2006 | Gogl et al. | 257/659 |
| 2007/0059877 | A1 | 3/2007 | Koo et al. | |

FOREIGN PATENT DOCUMENTS

KR    100 619 300 B1    8/2006

OTHER PUBLICATIONS

The International Search Report from PCT/KR2007/003249.
The European Search Report from EP 07 11 2597.
McGuire J.P. et al., "Silicon Inversion Layer with a Ferromagnetic Gate: A Novel Spin Source (invited)", *Journal of Applied Physics*, 95(11):6625-6629 (2004).
Datta and Das, "Electronic Analog of the Electro-Optic Modulator", *Appl. Phys Lett.*, 56(7):665-667 (1990).

* cited by examiner

*Primary Examiner*—Kiesha L Rose
*Assistant Examiner*—Mark W Tornow
(74) *Attorney, Agent, or Firm*—Perkins Coie LLP

(57) ABSTRACT

Disclosed herein is a spin transistor including: a semiconductor substrate having a channel layer formed therein; first and second electrodes which are formed to be spaced apart from each other on the substrate at a predetermined distance along a longitudinal direction of the channel layer; a source and drain which include magnetized ferromagnetic materials and are formed to be spaced apart form each other between the first electrode and the second electrode at a predetermined distance along the longitudinal direction of the channel layer; and a gate which is formed on the substrate between the source and the drain, and adjusts spin orientations of electrons passing through the channel layer, wherein the electrons passing through the channel layer are spin-aligned at a lower side of the source by a stray magnetic field of the source and spin-filtered at a lower side of the drain by a stray field of the drain.

21 Claims, 9 Drawing Sheets (a)

(b)

SPIN TRANSISTOR USING STRAY MAGNETIC FIELD

CLAIM PRIORITY

This application claims the benefit of Korean Patent Application No. 2007-000888 filed on Jan. 4, 2007, in the Korean Intellectual Property Office, the disclosure of which is incorporated herein by reference.

BACKGROUND OF THE INVENTION

1. Field of the Invention

The present invention relates to a spin transistor, and more particularly to a spin transistor which receives spin information through a source using a strong stray magnetic field generated by a ferromagnetic material, adjusts a spin orientation by the control of a gate, and selectively outputs electrons in a desired spin orientation through a drain.

2. Description of the Related Art

Today, a representative element of integrated circuit (IC) technology is based on a metal oxide semiconductor field effect transistor (MOSFET). A memory element such as DRAM or flash memory, an application specific integrated circuit (ASIC), a microprocessor, or a logic circuit includes a MOSFET for ON/OFF switching operation as a basic component. Recently, a new concept element which is widely studied is a spin field effect transistor (spin-FET). Whereas only charges in semiconductor are controlled using an electric field in the existing semiconductor-based transistor, charges and spin are simultaneously controlled in the spin transistor. The spin transistor can be used as a switching element and a logic circuit by controlling spin-polarized electrons.

In the MOSFET currently being used as an important element in the semiconductor field, power consumption and area will be hardly reduced. The MOSFET is confronted with a physical limitation of an oxide layer. In order to solve such problems, spin precession of the electrons is controlled by a voltage. The spin transistor includes a source, a drain, and a channel for connecting them. The channel of the spin transistor may be a two-dimensional electron channel layer.

However, in a conventional spin transistor (for example, see Datta-Das spin transistor (Applied Physics Letters, vol. 56, 665, 1990) or a magnetic spin injected field effect transistor disclosed in U.S. Pat. No. 5,654,566), spin information needs to be injected from a ferromagnetic material to a semiconductor or from a semiconductor to a ferromagnetic material. However, the semiconductor and the ferromagnetic material, including metal, are significantly different from each other in electric conductivity. Thus, the injection efficiency of the spin information is very low. That is, the information may be lost when passing through a junction surface therebetween and thus a clear signal is difficult to obtain from the spin transistor.

SUMMARY OF THE INVENTION

The present invention has been made to solve the foregoing problems of the prior art and therefore an aspect of the present invention is to provide a spin transistor which can transmit spin information to charges without passing through a junction surface between a semiconductor and a ferromagnetic material, and has very high spin transmission effect.

According to an aspect of the invention, the invention provides a spin transistor. The spin transistor includes: a semiconductor substrate having a channel layer formed therein; first and second electrodes which are formed to be spaced apart from each other on the substrate at a predetermined distance along the longitudinal direction of the channel layer; a source and drain which include magnetized ferromagnetic materials and are formed to be spaced apart form each other between the first electrode and the second electrode at a predetermined distance along the longitudinal direction of the channel layer; and a gate which is formed on the substrate between the source and the drain, and adjusts spin orientations of electrons passing through the channel layer. The electrons passing through the channel layer are spin-aligned at a lower side of the source by a stray magnetic field of the source and spin-filtered at a lower side of the drain by a stray magnetic field of the drain.

Preferably, the spin transistor may further include a high-permeability material which is formed to be spaced apart from the source and the drain at a respective predetermined gap such that a space for spin-alignment and spin-filtering is provided between the source and the drain, and the high-permeability material may be formed between the gate and the channel layer. The high-permeability material may be a mu-metal.

Preferably, the substrate may have a ridge structure in which parts of the both sides of the channel layer are cut out in the longitudinal direction of the channel layer and the width of the channel layer may be defined by the ridge structure. Preferably, an insulating layer for planarization may be formed on the cut-out parts of the ridge structure. The insulating layer may include $SiO_2$ or $TaO_2$.

Preferably, the channel layer of the substrate may include a two-dimensional electron gas layer. The two-dimensional electron gas layer includes a material selected from a group of GaAs, InAs and InGaAs.

Preferably, the substrate may further include upper and lower cladding layers which are respectively formed above and below the channel layer. Each of the upper and lower cladding layers may include a double cladding layer which has a two-layer structure including an InGaAs layer and an InAlAs layer. At this time, the substrate may further include an InAlAs carrier supplying layer formed below the lower cladding layer. The substrate may further include an InAs capping layer formed on the upper cladding layer.

Preferably, at least one of the source and the drain may include ferromagnetic metal. The ferromagnetic metal may be selected from a group of Fe, Co, Ni, CoFe, NiFe and a combination thereof.

Preferably, at least one of the source and the drain may include a ferromagnetic semiconductor or a diluted magnetic semiconductor. The ferromagnetic semiconductor may be (Ga, Mn)As.

Preferably, the magnetization directions of the source and the drain may be parallel to the longitudinal direction of the channel layer and may be opposite to each other.

Preferably, the magnetization directions of the source and the drain may be vertical to the surface of the channel layer. At this time, the magnetization directions of the source and the drain may be parallel to each other.

Preferably, the electrons which arrive at the lower side of the drain may be spin-adjusted to be parallel or anti-parallel to the direction of the stray magnetic field of the drain by a voltage applied to the gate, in order to control an ON/OFF operation of the spin transistor. In this case, the transistor is turned on when the spin orientation of the electrons which arrive at the lower side of the drain is parallel to the direction of the stray magnetic field of the drain and the transistor is turned off when the spin orientation of the electrons which arrive at the lower side of the drain is anti-parallel to the direction of the stray magnetic field of the drain.

According to another aspect of the invention, the invention provides a spin transistor. The spin transistor includes: a semiconductor substrate having a channel layer formed therein; a source and drain which include magnetized ferromagnetic materials and are formed to be spaced apart from each other on the substrate at a predetermined distance in a longitudinal direction of the channel layer; an electrode which is formed adjacent to the source and is provided as a current input terminal; and a gate which is formed on the substrate between the source and the drain and adjusts the spin orientation of electrons passing through the channel layer. The electrons passing through the channel layer are spin-aligned by a stray magnetic field of the source at the lower side of the source and are directly into injected into the drain.

According to another aspect of the invention, the invention provides a spin transistor. The spin transistor includes: a semiconductor substrate having a channel layer formed therein; a source and drain which include magnetized ferromagnetic materials and are formed to be spaced apart from each other on the substrate at a predetermined distance in a longitudinal direction of the channel layer; an electrode which is formed adjacent to the drain and is provided as a current output terminal; and a gate which is formed on the substrate between the source and the drain and adjusts the spin orientation of electrons passing through the channel layer. The electrons which are directly injected through the source pass through the channel layer and are filtered by a stray magnetic field of the drain at the lower side of the drain.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
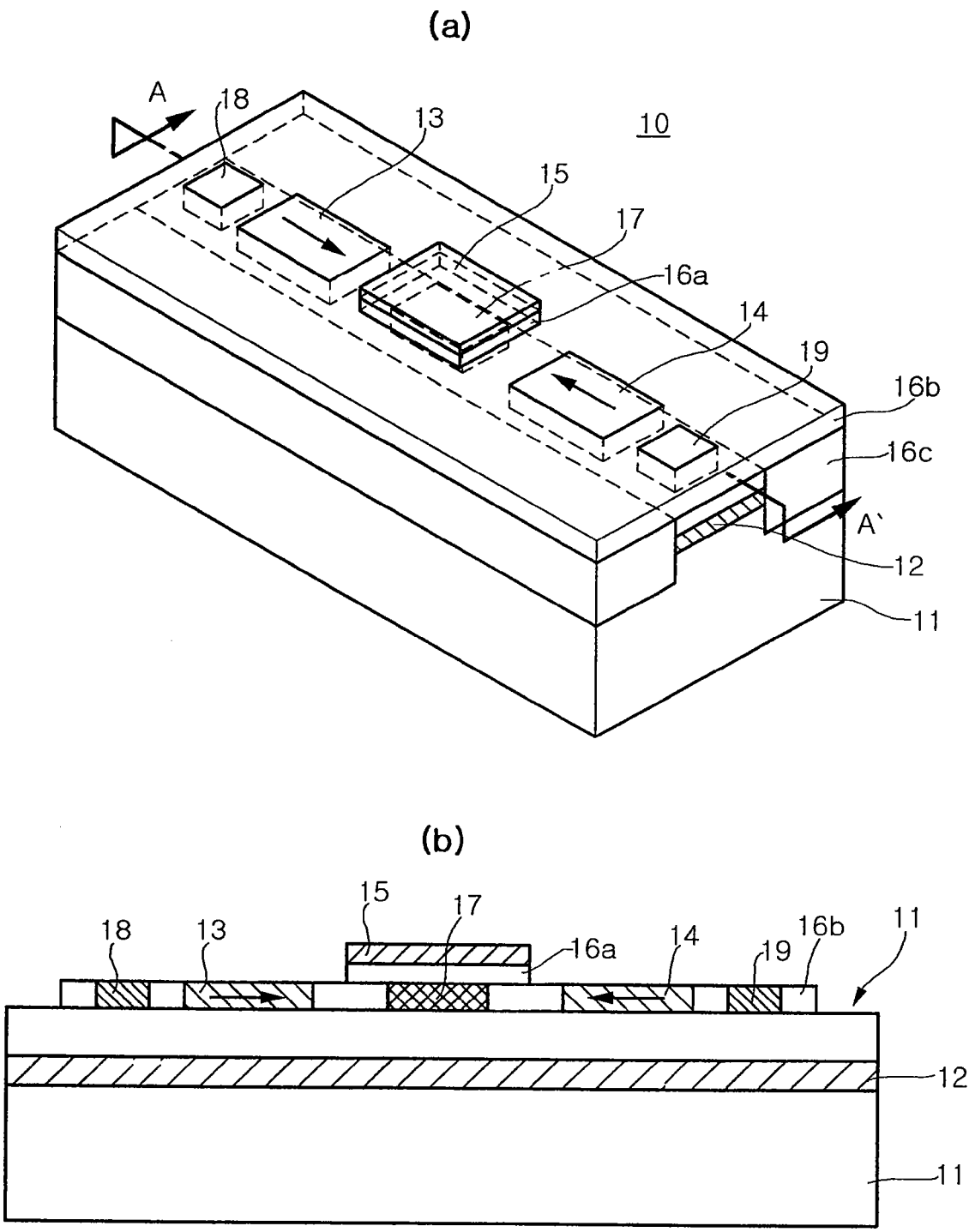
FIGS. 1(a) and 1(b) are, respectively, a perspective view and a cross-sectional view of a spin transistor according to an exemplary embodiment of the present invention.

FIGS. 1(a) and 1(b) are, respectively, a perspective view and a cross-sectional view of a spin transistor according to an exemplary embodiment of the present invention.

Referring to FIGS. 1(a) and 1(b), the spin transistor 10 according to the present embodiment includes a semiconductor substrate 11 having a channel layer 12 formed therein, and first and second electrodes 18 and 19, a source 13, a gate 15 and a drain 14, all of which are formed on the semiconductor substrate 11.

The semiconductor substrate 11 has a ridge structure in which the parts of the both sides of the channel layer 12 are cut out. The width of the channel layer 12 is defined by the ridge structure. The substrate having the ridge structure may be formed using lithography and ion milling.

The width of the channel layer 12 is defined by the length of a protruded region in a short axis direction of the semiconductor substrate 11 and the length of the channel layer is defined by distance between the source 13 and the drain 14.

For planarization, an oxide layer 16c is formed on the cut-out parts of the substrate. The oxide layer 16c is preferably composed of $TaO_2$ or $SiO_2$ and serves as insulation from other adjacent channels.

The first electrode 18, the source 13, a mu-metal 17, the drain 14, and the second electrode 19 are formed on the same plane above the channel layer 12.

The first electrode 18 and the second electrode 19 are formed to be spaced apart from each other above the channel layer 12 of the substrate 11 in the longitudinal direction of the channel layer.

The first electrode 18 and the second electrode 19 are connected to an external terminal via wiring in order to flow current through the channel layer 12 in the transistor.

In the present invention, the current flows into the first electrode 18 and the second electrode 19, instead of directly flowing into the source 13 and the drain 14.

By the above-described configuration, it is possible to prevent spin information from being lost when passing through a junction layer between the source and drain composed of a ferromagnetic material and the semiconductor substrate and thus to increase injection efficiency.

The source 13 and drain 14, which are spaced apart from each other in the longitudinal direction of the channel layer, are formed between the first electrode 18 and the second electrode 19.

The source 13 and the drain 14 may be formed by depositing a ferromagnetic material using a sputtering process. It is preferable that the thickness of the ferromagnetic material is about 60 nm to 80 nm and the size thereof is about 200 nm×800 nm, by which a single domain can be formed.

The source 13 and the drain 14 are formed of the ferromagnetic material and magnetized in a specific direction. In the present embodiment, the magnetization directions of the source 13 and the drain 14 are parallel to the longitudinal direction of the channel layer 12 and are opposite to each other.

The high-permeability material 17 is formed between the source 13 and the drain 14 formed on the substrate 11. The high-permeability material 17 may be a mu-metal. The mu-metal indicates a material including 75% nickel (Ni), 15% iron (Fe), and Copper (Cu) and molybdenum (Mo).

The high-permeability material can prevent an unwanted magnetic field from influencing the channel. However, since a high-permeability material may be a factor in causing noise, it is preferable that the high-permeability material is formed in a circle or a square such that an anisotropy shape is not obtained so as to prevent the magnetic field from flowing out of the material.

It is preferable that the high-permeability material 17 is formed adjacent to the source and the drain such that a minimum space for spin alignment and filtering due to the stray magnetic fields of the source and the drain and the high-permeability material 17 is formed.

The oxide layer 16b is formed on the upper surface of the substrate on which the first electrode 18, the source 13, the mu-metal 17, the drain 14, and the second electrode 19 are not formed.

The oxide layer 16a and a gate 15 are formed on the mu-metal 17 in this order. The oxide layer 16a is used to prevent current from being directly leaked from the gate 15 to the semiconductor substrate.

The precession degree of the spin electrons which pass through the channel located below the gate is adjusted by applying a voltage to the gate 15.

Figure 2:
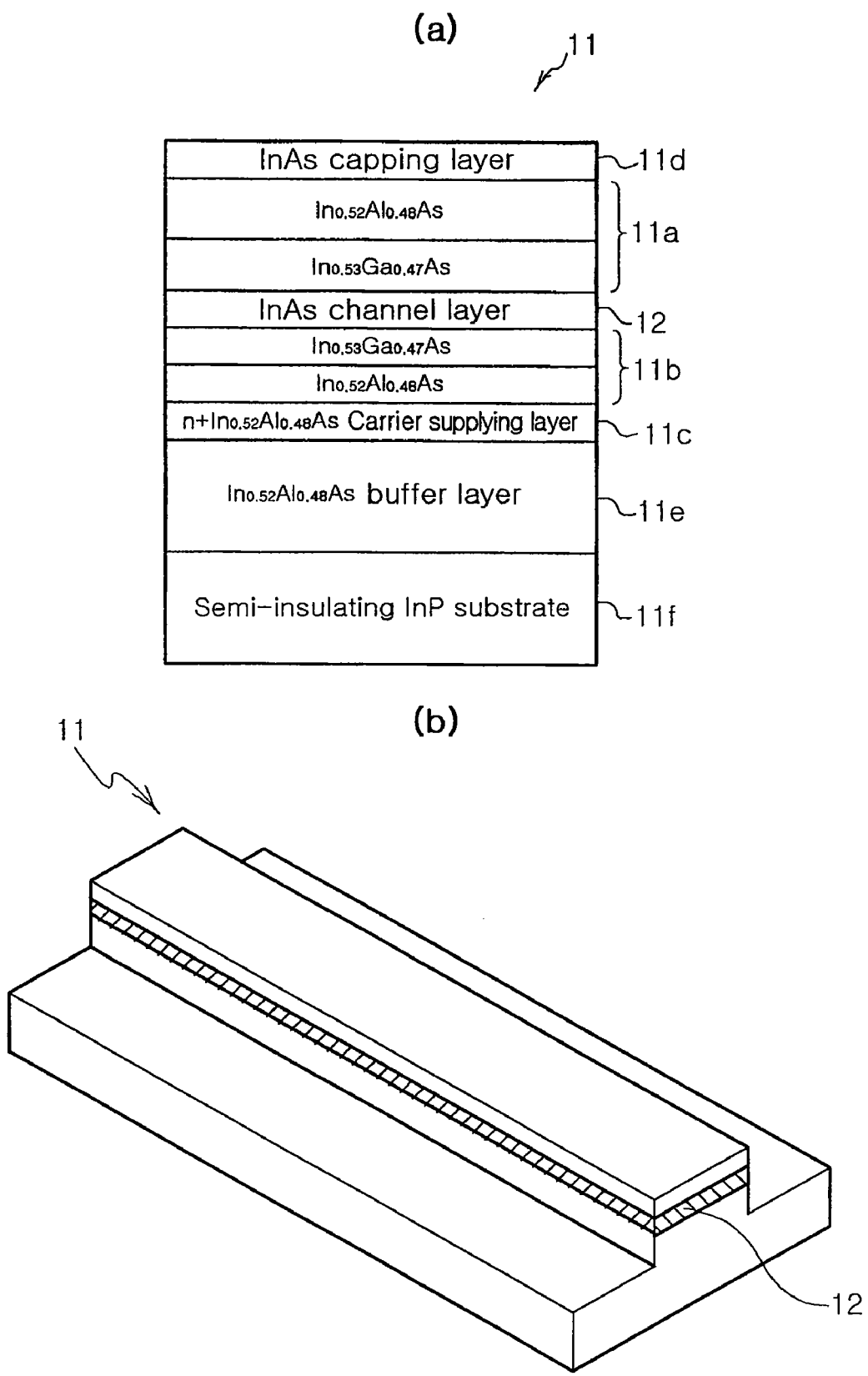
FIGS. 2(a) and 2(b) are, respectively, a schematic cross-sectional view and a perspective view of a semiconductor substrate used in the spin transistor according to the exemplary embodiment of the present invention.

FIGS. 2(a) and 2(b) are, respectively, a schematic cross-sectional view and a perspective view of the semiconductor substrate used in the spin transistor according to the exemplary embodiment of the present invention.

As shown in FIG. 2(a), the substrate 11 may includes an InAlAs buffer layer 11e, an n+InAlAs carrier supplying layer 11c, an InAlAs/InGaAs lower cladding layer 11b, an InAs channel layer 12, an InGaAs/InAlAs upper cladding layer 11a, and an InAs capping layer 11d which are sequentially laminated on a semi-insulating InP substrate 11f. The substrate 11 has a quantum well structure. That is, the InAs channel layer 12 forms the quantum well by the undoped lower cladding layer 11b and the upper cladding layer 11a. In particular, the well layer 12 having a double cladding structure serves as a channel for two-dimensional electron gas.

The buffer layer 11e is used to release lattice mismatch between the InP substrate 11f and the quantum well structure formed thereon. The InAs capping layer 11d located at the uppermost side of the substrate 11 is used to prevent from oxidation and deformation of the substrate 11 occurring during the process.

In the present embodiment, an InAs layer is used as the channel layer 12. However, the present invention is not limited to this embodiment. For example, a GaAs layer, an InAs layer or an InGaAs may be used as the channel layer 12.

Referring to FIG. 2(b), the semiconductor substrate 11 has the ridge structure in which the parts of the both sides of the channel layer 12 are cut out. The width of the channel layer 12 is defined by the ridge structure. The substrate having the ridge structure may be formed using lithography and ion milling.

The width of the channel layer 12 is defined by the length of the protruded region in the short axis direction of the semiconductor substrate 11 and the length of the channel layer is defined by the distance between source 13 and the drain 14.

The operation of the spin transistor according to the present invention will be described with reference to FIGS. 3 and 4.

When a vertical electric field E and a wave vector k of electrons passing through the channel exist in a two-dimensional electron gas layer, a magnetic field of $H_{eff} \propto k \times E$ is induced by spin-orbit coupling (Rashba effect). When the electrons travel in an X direction along the channel and the electric field is applied in a Z direction by the voltage of the gate, the magnetic field is induced in a Y direction by the spin-orbit coupling. Finally, the electrons precess in the X-Z plane.

Figure 3:
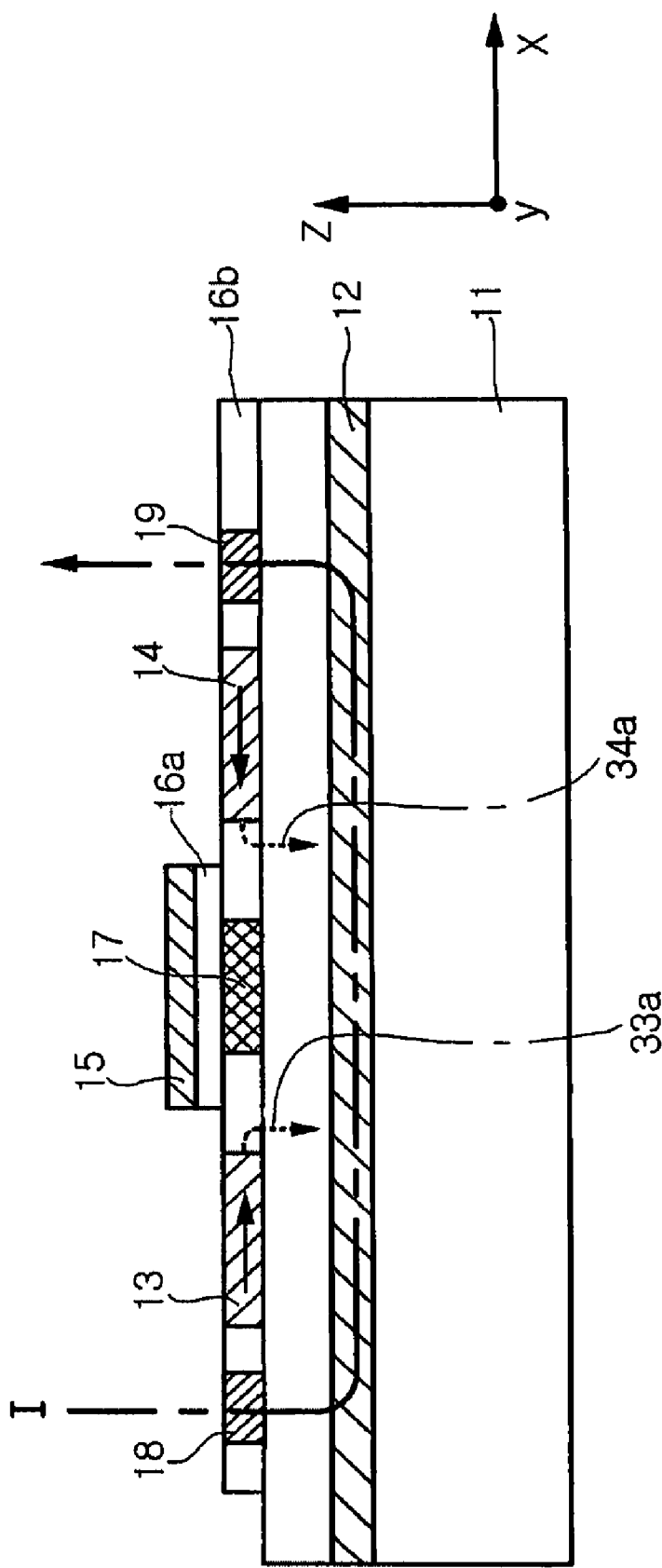
FIG. 3 is a cross-sectional view showing current flow and the direction of a stray magnetic field in the spin transistor according to the exemplary embodiment of the present invention.
Figure 4:
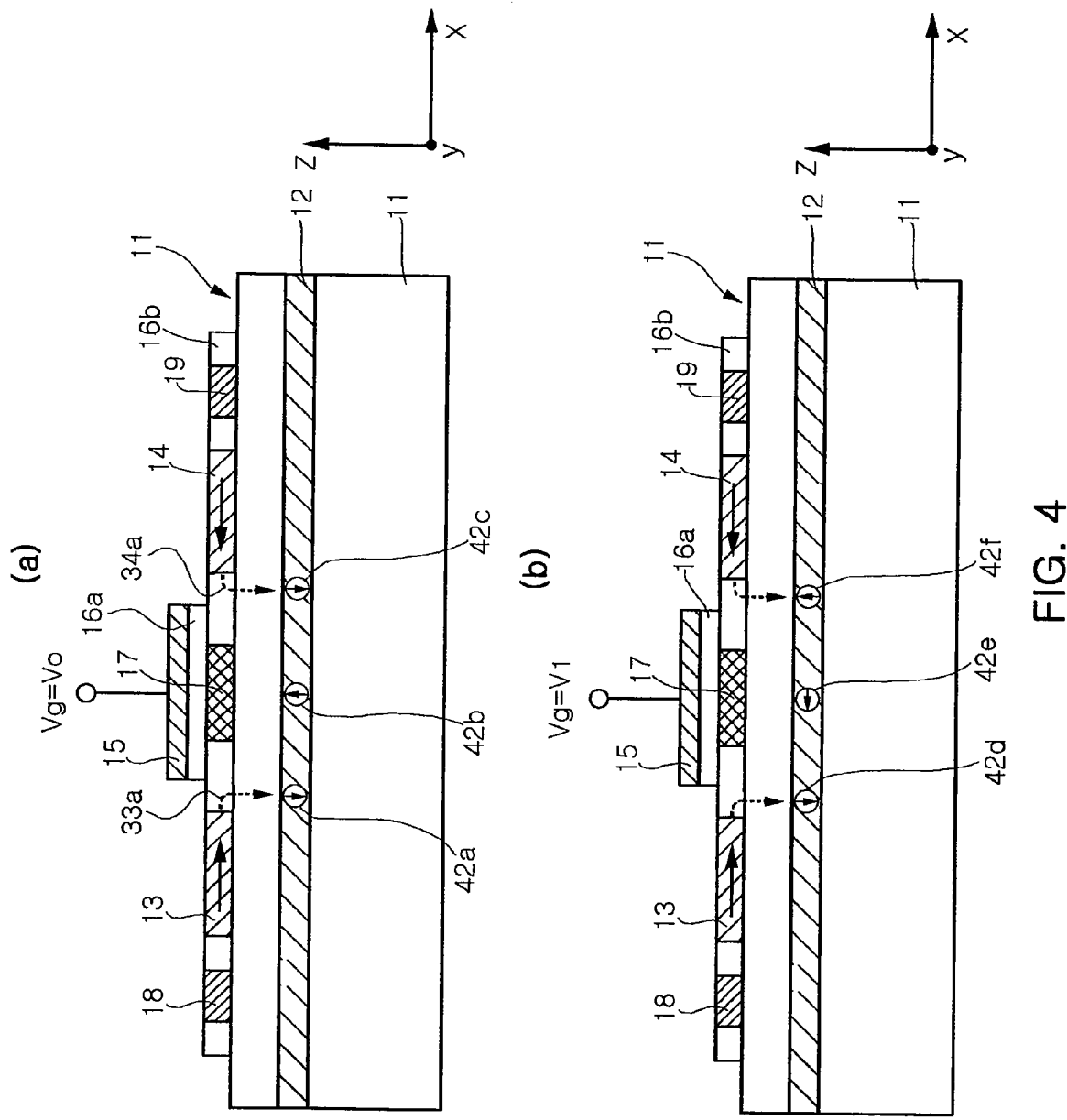
FIGS. 4(a) and 4(b) are cross-sectional views showing the ON/OFF operation of the spin transistor according to the exemplary embodiment of the present invention.

As shown in FIG. 3, in the structure of the spin transistor according to the present invention, the first electrode 18 and the second electrode 19 are formed outside the source 13 and the drain 14 formed of the ferromagnetic material, and the current flows into the first and second electrodes 18 and 19.

By this structure, the current I does not pass through the junction surface between the ferromagnetic material and the semiconductor substrate such that the injection efficiency increases compared with the case where the spin information is transmitted through the junction surface.

Referring to FIG. 3, the electrons inputted through the first electrode 18 pass through the channel layer 12. Random spin-electrons which pass through the channel layer 12 are spin-aligned by a stray magnetic field 33a emitted from the right end of the source 13. The spin-aligned electrons precess in a desired direction by the voltage applied to the gate 15 and selectively filtered by a stray magnetic field 34a emitted from the left end of the drain 14.

For example, if the electrons which arrive at the lower side of the drain 14 have a spin in the same direction as that of the stray magnetic field 34a of the drain, the electrons pass easily and thus resistance decreases (ON state), and if the electrons which arrive at the lower side of the drain 14 have a spin in the direction opposite to that of the stray magnetic field 34a of the drain, the electrons barely pass and thus the resistance increases (OFF state).

In the present embodiment, the current flows into the first and second electrodes. However, the present invention is not limited to this embodiment. The electrons may be injected into the first electrode and outputted from the drain or the electrons may be injected into the source and outputted from the second electrode.

FIGS. 4(a) and 4(b) are cross-sectional views showing the ON/OFF operation of the spin transistor according to the exemplary embodiment of the present invention.

Referring to FIG. 4(a), when an ON voltage $V_0$ is applied to the gate, the spin orientation of the electrons which enter the channel layer 12 through the first electrode 18 becomes a negative Z-axis direction (42a) by the stray magnetic field 33a which is generated at the source 13 vertically with respect to one plane of the channel layer 12.

The electrons which flow in the channel layer 12 precess due to the Rashba effect and are spin up in a positive Z-axis direction (42b) by the voltage $V_0$ applied to the gate 15 when passing through the lower side of the gate 15.

The spin-up electrons continuously precess toward the drain and the spin orientation of the electrons becomes in the negative Z-axis direction (42c) when the electrons arrive at the drain 14. Since the spin orientation is equal to the direction of a stray magnetic field 34a generated at the left side of the drain 14, the spin transistor is turned on.

Referring to FIG. 4(b), when an OFF voltage $V_1$ is applied to the gate, the spin orientation of the electrons which enter the channel layer 12 through the first electrode 18 becomes the negative Z-axis direction (42d) by the stray magnetic field 33a which is generated at the source 13 vertically with respect to one plane of the channel layer 12.

The electrons which flow in the channel layer 12 precess due to the Rashba effect and are spin-aligned in a negative X-axis direction (42e) by the voltage $V_1$ applied to the gate 15 when passing through the lower side of the gate 15.

The spin-aligned electrons continuously precess toward the drain and the spin orientation of the electrons becomes the positive Z-axis direction (42f) when the electrons arrive at the drain 14. Since the spin orientation is opposite to the direction of the stray magnetic field 34a generated at the left side of the drain 14, the spin transistor is turned off.

Figure 5:
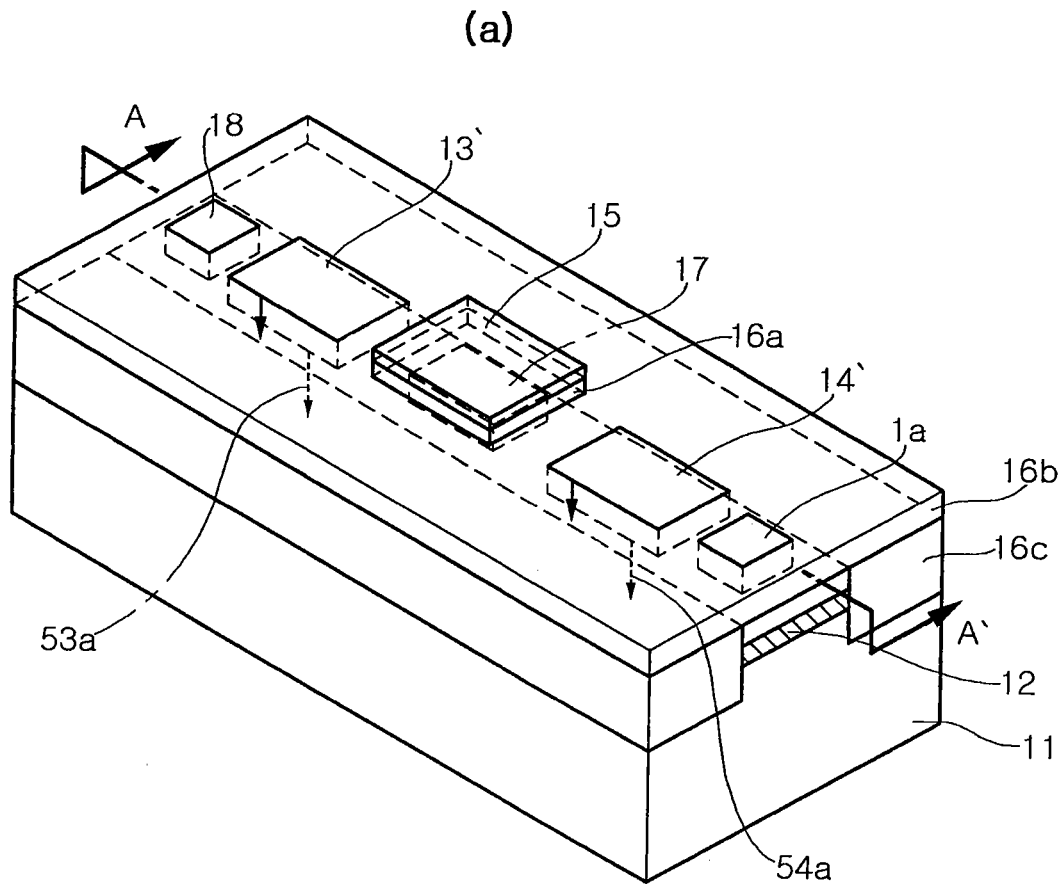
FIGS. 5(a) and 5(b) are, respectively, a perspective view and a cross-sectional view of a spin transistor according to another embodiment of the present invention.
Figure 5:
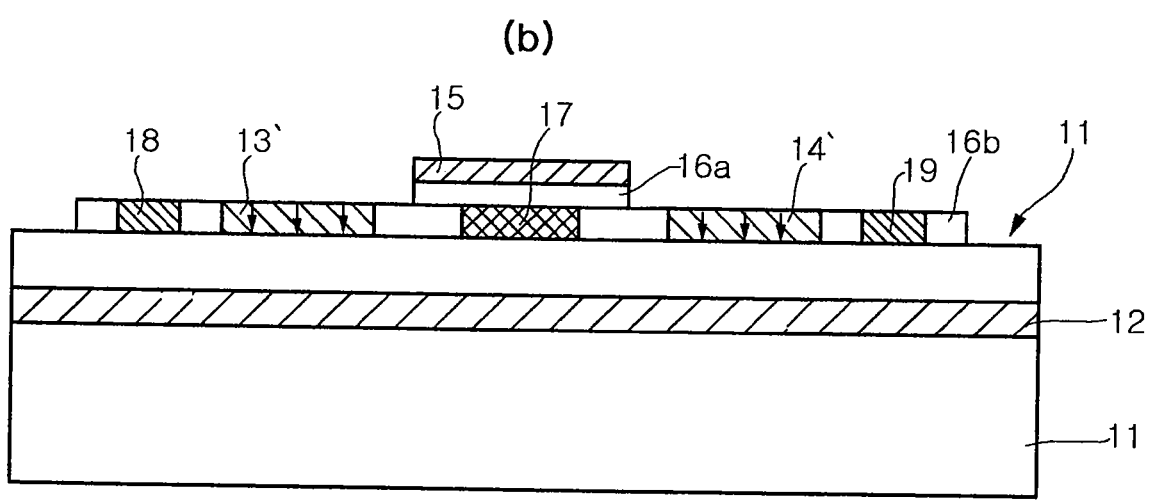

FIGS. 5(a) and 5(b) are, respectively, a perspective view and a cross-sectional view of a spin transistor according to another embodiment of the present invention.

In the present embodiment, the magnetization directions of a source 13' and a drain 14' are vertical to one plane of the channel layer 12. The directions of the stray magnetic fields 53a and 54a generated at the magnetized source and drain 13' and 14' are equal to the magnetization directions of the ferromagnetic materials 13' and 14'. As a result, the stray magnetic fields 53a and 54a are directed downward (vertical), as shown in FIG. 5(a).

Accordingly, the electrons which pass through the channel layer 12 are spin-aligned by the magnetization directions of the ferromagnetic materials and the spin-aligned electrons are adjusted by the voltage applied to the gate such that the ON/OFF operation of the transistor is controlled.

As a method of allowing the magnetization directions of the source 13' and the drain 14 to be vertical with respect to one plane of the channel layer 12, a method of using shape anisotropy or a method of alternatively laminating ferromagnetic metal and non-ferromagnetic metal multilayer may be used.

Figure 6:
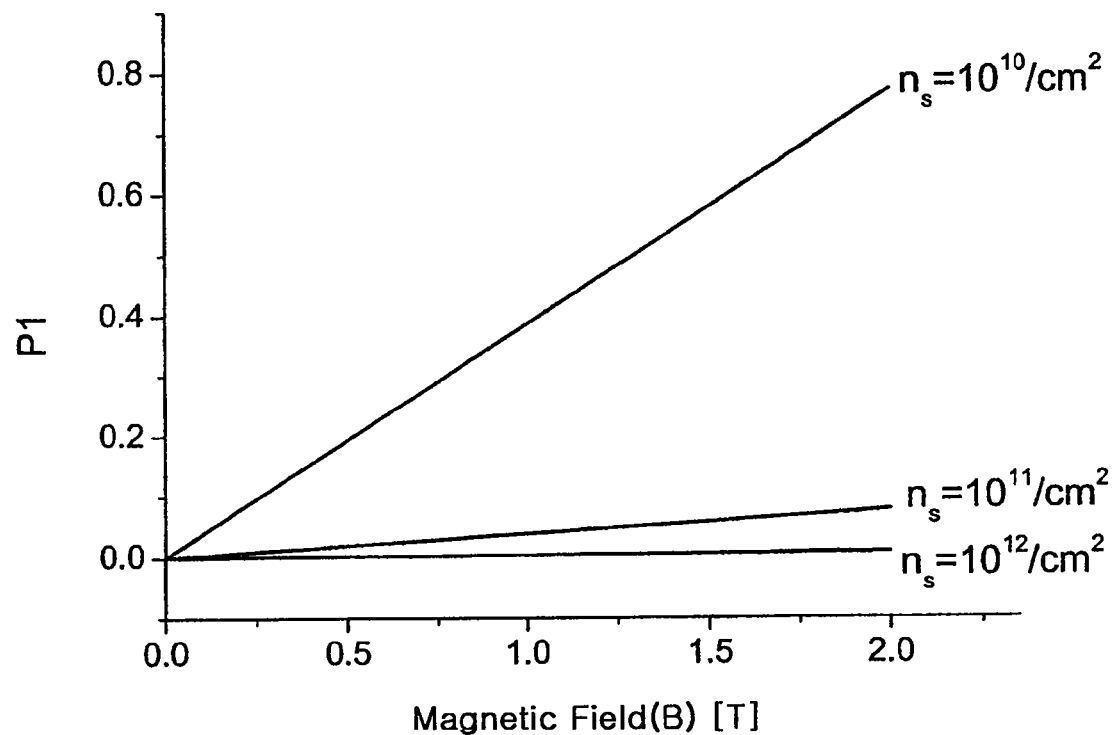
FIG. 6 is a graph showing the degree that electrons are spin-aligned according to the intensity of a stray magnetic field generated at a source.

FIG. 6 is a graph showing the degree that electrons are spin-aligned according to the intensity of the stray magnetic field generated at the source, according to the embodiment of the present invention.

Referring to FIG. 6, a vertical axis P1 indicates a value obtained by dividing the number of electrons aligned in the direction of the stray magnetic field by the total number of electrons. When P1 is 1, it is indicated that all electrons are aligned in the direction of the stray magnetic field. A horizontal axis indicates the intensity of the stray magnetic field.

An input parameter uses the two-dimensional electron gas structure having the InAs channel.

Generally, as the intensity of the stray magnetic field increases, the degree that the electrons are spin-aligned increases. In particular, the alignment degree varies depending on the carrier concentration of the electron gas. That is, the alignment degree of the electron gas having a carrier concentration $n_s$ of $10^{11}/cm^2$ is significantly larger than that of the electron gas having a carrier concentration $n_s$ of $10^{10}/cm^2$. Accordingly, when the carrier concentration ns of the electron gas is reduced, it is possible to easily perform alignment with even a small magnetic field.

Figure 7:
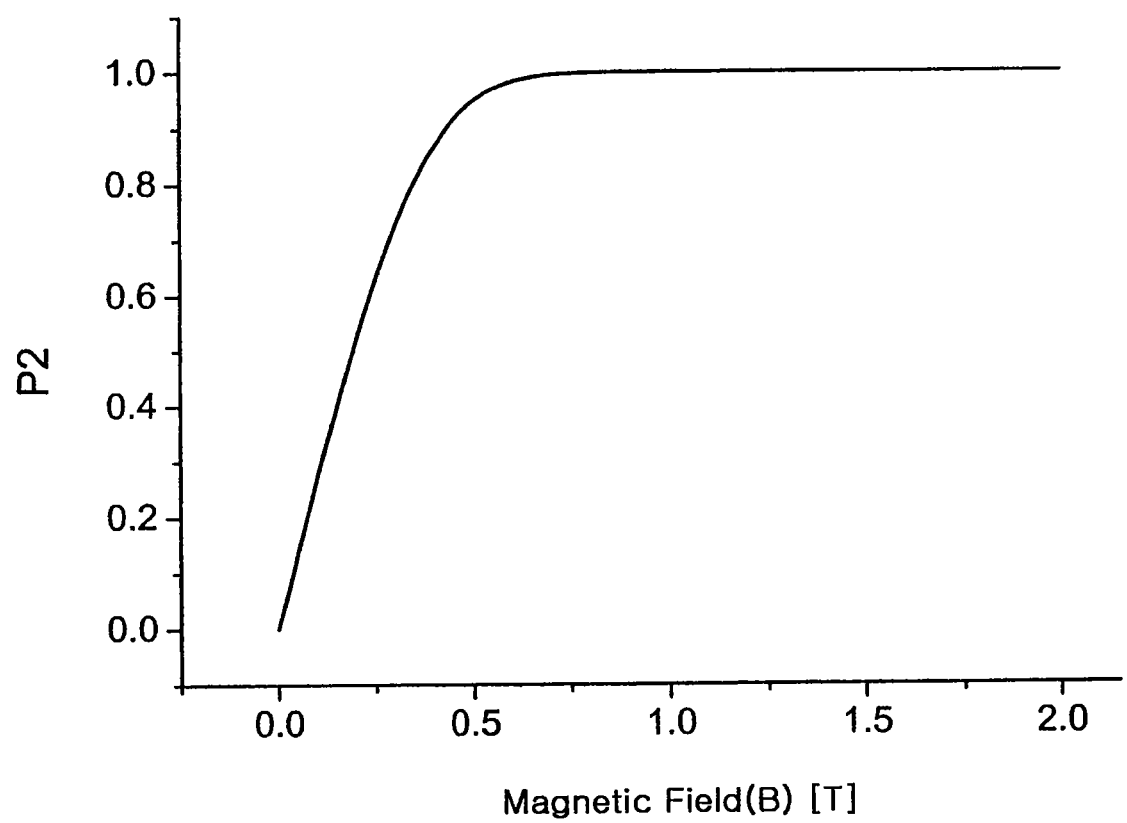
FIG. 7 is a graph showing the degree that electrons in a spin orientation selected by a drain are transmitted according to the intensity of a stray magnetic field generated at a drain.

FIG. 7 is a graph showing the degree that electrons in a spin orientation selected by the drain are transmitted according to the intensity of the stray magnetic field generated at the drain.

A vertical axis P2 indicates a value obtained by dividing the number of spin electrons transmitted in the direction of the stray magnetic field by the total number of transmitted electrons. When P2 is 1, it is indicated that only electrons which are spin-polarized in the direction of the stray magnetic field pass through the lower side of the drain. A horizontal axis indicates the intensity of the stray magnetic field.

In the graph, when the intensity of the stray magnetic field is larger than or equal to 0.7 T, it can be seen that most of passed electrons are selected by the stray magnetic field. Accordingly, noise is reduced and thus a signal-to-noise ratio can increase.

Figure 8:
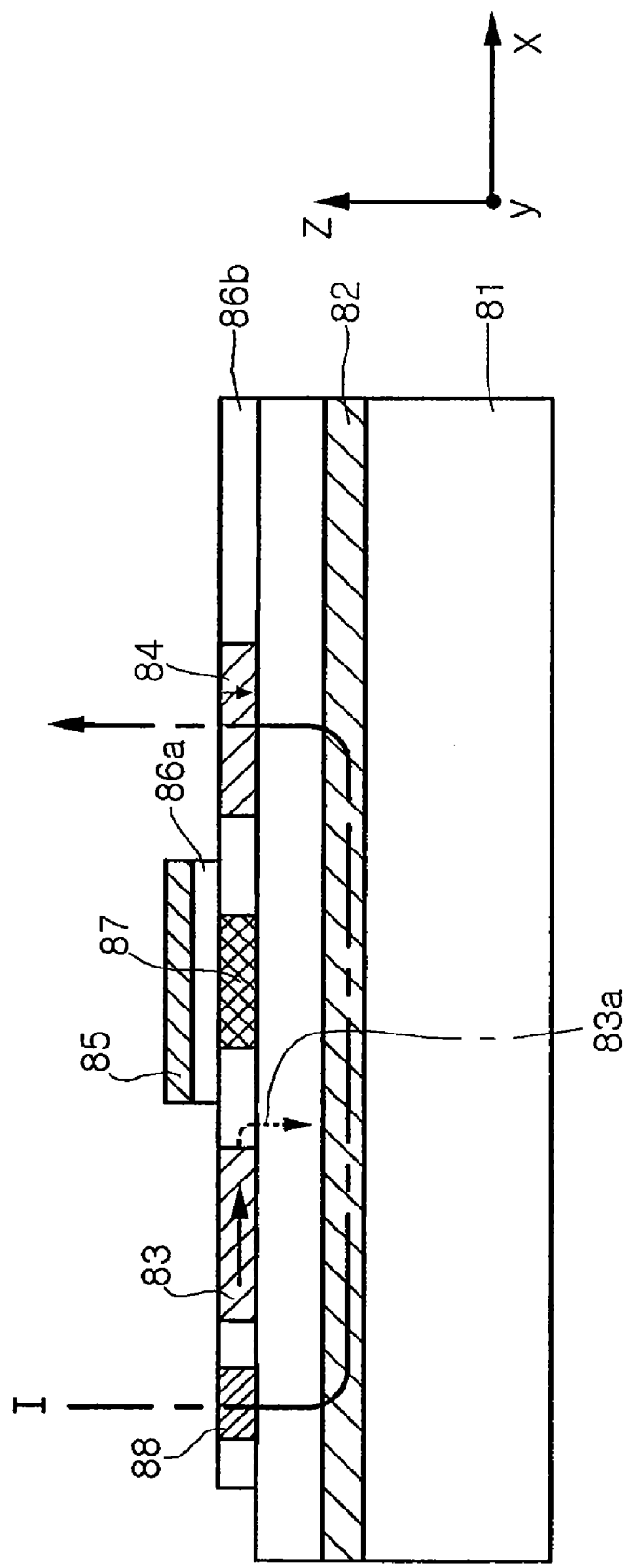
FIGS. 8 and 9 are cross-sectional views of a spin transistor according other embodiments of the present invention.
Figure 9:
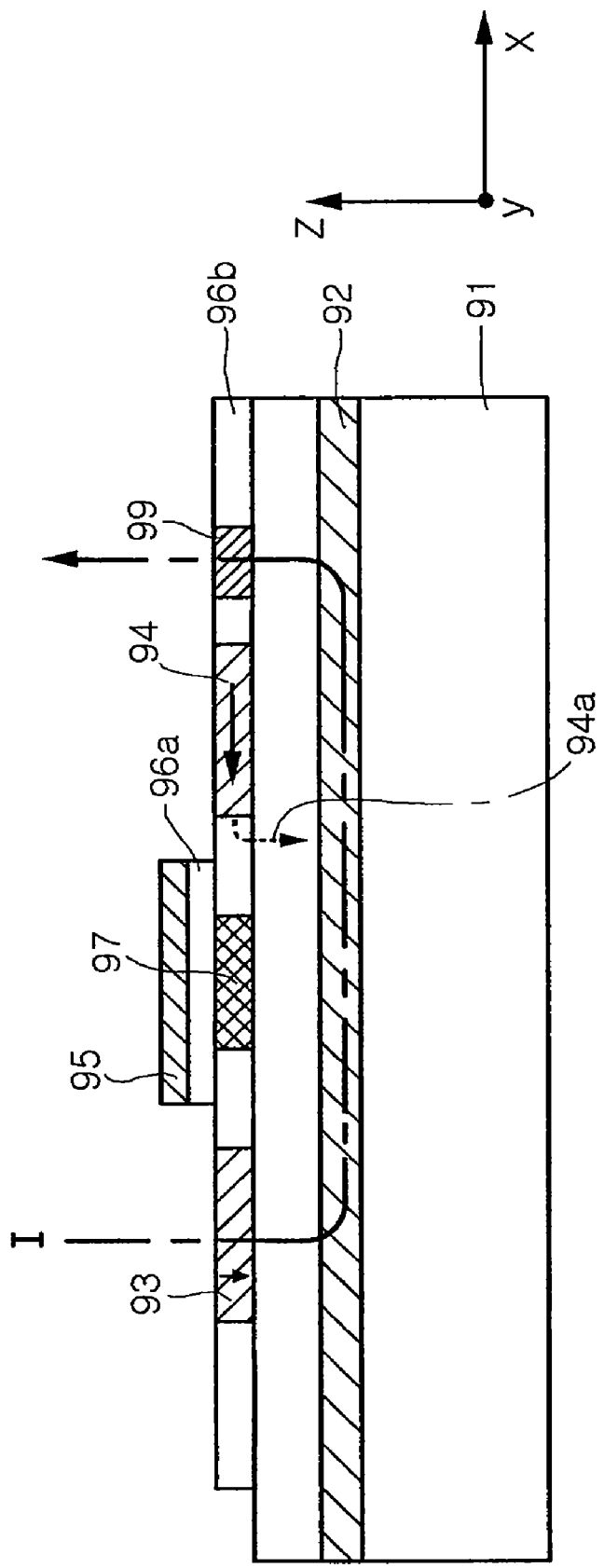

FIGS. 8 and 9 are cross-sectional views of spin transistors according other embodiments of the present invention.

In the embodiment shown in FIG. 8, in a source side, electrons are spin-aligned using a stray magnetic field, and, in a drain side, the electrons are directly injected into the drain, similar to the conventional method.

Referring to FIG. 8, current flows into a channel layer 82 through an electrode 88 which is formed adjacent to the source 83. The electrons which flow in the channel layer are spin-aligned at the lower side of the source 83 by a stray magnetic field 83a of the source. The spin-aligned electrons precess and flow in the channel layer. The electrons which flow in the channel layer may be spin up or down by a voltage applied to a gate 85. The electrons which pass through the lower side of the gate are directly injected into the drain 84. When the spin orientation of the electrons which arrive at the drain and the magnetization direction of the drain are in a parallel state, resistance decreases (ON state) and, when the spin orientation of the electrons which arrive at the drain and the magnetization direction of the drain are in an anti-parallel state, the resistance increases (OFF state).

In the embodiment shown in FIG. 9, in a drain side, electrons are spin-filtered using a stray magnetic field, and, in a source side, the electrons are directly injected from the source into a semiconductor substrate, similar to the conventional method.

Referring to FIG. 9, the electrons forming current are directly injected into a channel layer 92 through the source 93 and are outputted from an electrode 99 which is formed adjacent to the drain 94. In the present embodiment, the current directly flows into the source 93 such that the electrons are injected from the source 93 into the channel layer 92. The electrons which flow in the channel layer 92 may be spin up or down by a voltage applied to a gate 95. When the electrons which pass through the lower side of the gate 95 flow in the lower side of the drain 94, resistance increases (ON state) if the spin orientation of the electrons and the direction 94a of the stray magnetic field of the drain are in a parallel state, and the resistance increases (OFF state) if the spin orientation of the electrons and the direction 94a of the stray magnetic field of the drain are in an anti-parallel state.

Instead of forming input and output electrodes at the both ends of the source and the drain, even when only one electrode is formed at any one of the source and the drain such that the stray magnetic field is used in any one of the source and the drain and the current directly flows into the other of the source and the drain, the electrons can be spin-aligned and spin-filtered by adequately adjusting the voltage of the gate and injection efficiency can be improved.

As set forth above, according to exemplary embodiments of the invention, electrons can be sufficiently spin-polarized by a stray magnetic field emitted from a ferromagnetic material and the electrons can be selectively received using filtering effect in a drain, thereby obtaining a resistance difference.

According to the exemplary embodiments of the invention, injection efficiency can be prevented from deteriorating due to passage of a spin junction part and a spin signal can be detected with high efficiency. The present invention is applicable to a device having a high speed and low power consumption.

The present invention is not limited to the above-described embodiments and the attached drawings. That is, the shape of the semiconductor substrate having the channel layer formed therein and the magnetization direction of the ferromagnetic material may be variously implemented without departing from the scope of the present invention. While the present invention has been shown and described in connection with the preferred embodiments, it will be apparent to those skilled in the art that modifications and variations can be made without departing from the spirit and scope of the invention as defined by the appended claims.

We claim:

1. A spin transistor comprising:
   a semiconductor substrate having a channel layer formed therein;
   first and second electrodes which are formed to be spaced apart from each other on the substrate at a predetermined distance along a longitudinal direction of the channel layer;
   a first ferromagnetic region and a second ferromagnetic region which include magnetized ferromagnetic materials and are formed to be spaced apart form each other between the first electrode and the second electrode at a predetermined distance along the longitudinal direction of the channel layer, the first and second ferromagnetic regions being physically separated from the first and second electrodes and producing stray magnetic fields vertical to a top surface of the channel layer; and
   a gate which is formed on the substrate between the first and second ferromagnetic regions, and adjusts spin orientations of electrons passing through the channel layer, wherein the gate is insulated from the substrate by a gate oxide on the substrate, and the first and second ferromagnetic regions are disposed below the level of the gate oxide,
   wherein the electrons passing through the channel layer are spin-aligned at a lower side of the first ferromagnetic region by a stray magnetic field of the first ferromagnetic region and spin-filtered at a lower side of the second ferromagnetic region by a stray magnetic field of the second ferromagnetic region.

2. The spin transistor according to claim 1, further comprising a high-permeability material which is formed to be spaced apart from the first and second ferromagnetic regions at a respective predetermined gap such that a space for spin-alignment and spin-filtering is provided between the first and second ferromagnetic regions,
   wherein the high-permeability material is formed between the gate and the channel layer.

3. The spin transistor according to claim 2, wherein the high-permeability material is a mu-metal.

4. The spin transistor according to claim 1, wherein the substrate has a ridge structure in which parts of the both sides of the channel layer are cut out in the longitudinal direction of the channel layer and the width of the channel layer is defined by the ridge structure.

5. The spin transistor according to claim 4, wherein an insulating layer for planarization is formed on the cut-out parts of the ridge structure.

6. The spin transistor according to claim 5, wherein the insulating layer includes $SiO_2$ or $TaO_2$.

7. The spin transistor according to claim 1, wherein the channel layer of the substrate includes a two-dimensional electron gas layer.

8. The spin transistor according to claim 7, wherein the two-dimensional electron gas layer includes a material selected from a group of GaAs, InAs and InGaAs.

9. The spin transistor according to claim 1, wherein the substrate further comprises upper and lower cladding layers which are respectively formed above and below the channel layer.

10. The spin transistor according to claim 9, wherein each of the upper and lower cladding layers includes a double cladding layer which has a two-layer structure including an InGaAs layer and an InAlAs layer.

11. The spin transistor according to claim 9, wherein the substrate further comprises an InAlAs carrier supplying layer formed below the lower cladding layer.

12. The spin transistor according to claim 9, wherein the substrate further comprises an InAs capping layer formed on the upper cladding layer.

13. The spin transistor according to claim 1, wherein at least one of the first and second ferromagnetic regions includes ferromagnetic metal.

14. The spin transistor according to claim 13, wherein the ferromagnetic metal is selected from a group of Fe, Co, Ni, CoFe, NiFe and a combination thereof.

15. The spin transistor according to claim 1, wherein at least one of the first and second ferromagnetic regions includes a ferromagnetic semiconductor or a diluted magnetic semiconductor.

16. The spin transistor according to claim 15, wherein the ferromagnetic semiconductor is (Ga, Mn)As.

17. The spin transistor according to claim 1, wherein magnetization directions of the first and second ferromagnetic regions are parallel to the longitudinal direction of the channel layer, and are opposite to each other.

18. The spin transistor according to claim 1, wherein magnetization directions of the first and second ferromagnetic regions are vertical to the top surface of the channel layer.

19. The spin transistor according to claim 18, wherein the magnetization directions of the first and second ferromagnetic regions are equal to each other.

20. A spin transistor comprising:
    a semiconductor substrate having a channel layer formed therein;
    first and second electrodes which are formed to be spaced apart from each other on the substrate at a predetermined distance along a longitudinal direction of the channel layer;
    a first ferromagnetic region and a second ferromagnetic region which include magnetized ferromagnetic materials and are formed to be spaced apart form each other between the first electrode and the second electrode at a predetermined distance along the longitudinal direction of the channel layer, the first and second ferromagnetic regions being physically separated from the first and second electrodes and producing stray magnetic fields vertical to a top surface of the channel layer; and
    a gate which is formed on the substrate between the first and second ferromagnetic regions, and adjusts spin orientations of electrons passing through the channel layer, wherein the gate is insulated from the substrate by a gate oxide on the substrate, and the first and second ferromagnetic regions are disposed below the level of the gate oxide,
    wherein the electrons passing through the channel layer are spin-aligned at a lower side of the first ferromagnetic region by a stray magnetic field of the first ferromagnetic region and spin-filtered at a lower side of the second ferromagnetic region by a stray magnetic field of the second ferromagnetic region, and
    the electrons which arrive at the lower side of the second ferromagnetic region are spin-adjusted to be parallel or anti-parallel to the direction of the stray magnetic field of the second ferromagnetic region by a voltage applied to the gate, in order to control an ON/OFF operation of the spin transistor.

21. A spin transistor comprising:
    a semiconductor substrate having a channel layer formed therein;

first and second electrodes which are formed to be spaced apart from each other on the substrate at a predetermined distance along a longitudinal direction of the channel layer;

a first ferromagnetic region and a second ferromagnetic region which include magnetized ferromagnetic materials and are formed to be spaced apart form each other between the first electrode and the second electrode at a predetermined distance along the longitudinal direction of the channel layer, the first and second ferromagnetic regions being physically separated from the first and second electrodes and producing stray magnetic fields vertical to a top surface of the channel layer; and a gate which is formed on the substrate between the first and second ferromagnetic regions, and adjusts spin orientations of electrons passing through the channel layer, wherein the gate is insulated from the substrate by a gate oxide on the substrate, and the first and second ferromagnetic regions are disposed below the level of the gate oxide, wherein the electrons passing through the channel layer are spin-aligned at a lower side of the first ferromagnetic region by a stray magnetic field of the first ferromagnetic region and spin-filtered at a lower side of the second ferromagnetic region by a stray magnetic field of the second ferromagnetic region, the electrons which arrive at the lower side of the second ferromagnetic region are spin-adjusted to parallel or anti-parallel to the direction of the stray magnetic field of the second ferromagnetic region by a voltage applied to the gate, in order to control an ON/OFF operation of the spin transistor, the transistor is turned on when the spin orientation of the electrons which arrive at the lower side of the second ferromagnetic region is anti-parallel to the direction of the stray magnetic field of the second ferromagnetic region.

* * * * *